(12) United States Patent
Martineau et al.

(10) Patent No.: US 6,518,495 B1
(45) Date of Patent: Feb. 11, 2003

(54) HIGH-VOLTAGE DEVICE WITH A CASING AND PROTECTED AGAINST MOBILE ELECTRICAL CHARGES, AND SATELLITE EQUIPPED WITH THE DEVICE

(75) Inventors: Patrick Martineau, Blagnac (FR); Jean-Jacques Berthelier, Velizy (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/429,949

(22) Filed: Oct. 29, 1999

(30) Foreign Application Priority Data

Oct. 29, 1998 (FR) ............................................ 98 13581

(51) Int. Cl.[7] ................................................. H05K 9/00
(52) U.S. Cl. .................................. 174/35 R; 250/515.1
(58) Field of Search ................................ 174/35 R, 36, 174/35 MS, 35 TS; 250/505.1, 515.1, 517.1

(56) References Cited

U.S. PATENT DOCUMENTS 4,472,637 A * 9/1984 Sportelli et al. .......... 250/515.1
5,818,060 A 10/1998 Kimura ..................... 250/515.1
6,249,006 B1 * 6/2001 Sakiyama ................. 250/505.1

* cited by examiner

Primary Examiner—Jessica Han
(74) Attorney, Agent, or Firm—Sughrue Mion, PLLC

(57) ABSTRACT

High-voltage device with casing, protected against mobile electrical charges, and satellite equipped with the device. The device comprises a casing containing at least one high-voltage circuit and having at least one opening and means for opposing (a) the ingress into the casing of electrical charges of opposite sign to that of the high voltage, and (b) the existence outside the casing of high potentials due to the high voltage.

14 Claims, 4 Drawing Sheets

HIGH-VOLTAGE DEVICE WITH A CASING AND PROTECTED AGAINST MOBILE ELECTRICAL CHARGES, AND SATELLITE EQUIPPED WITH THE DEVICE

TECHNICAL FIELD

The present invention concerns a device comprising:

at least one high-voltage circuit, and a casing containing the circuit and having at least one opening which provides communication between the inside and the outside of the casing, electrical charges of opposite sign to that of the high voltage being likely to be present outside the casing and to enter the casing.

The invention applies in particular to a telecommunications satellite equipped with a device of the above kind.

DESCRIPTION OF THE PRIOR ART

Traveling wave tube amplifiers (TWTA) included in satellite telecommunications payloads have recently suffered malfunctions, and even complete failure, following the operation of ion thrusters used to control the position of the satellite.

SUMMARY OF THE INVENTION

The present invention addresses the above problem by opposing ingress of plasma generated by ion thrusters into the casings containing the power supply circuits of the TWTA and any leakage of electrical potential to the outside of the casings, such leakage encouraging the ingress of plasma by attracting a portion thereof to the vicinity of the high voltages present in the TWTA.

More generally, the invention aims to protect a device of the above type from electrical charges that can be present in the vicinity of its casing.

To be more precise, the present invention consists in a device of the above type which further includes:

protection means which do not block the opening and are adapted to oppose:
the ingress of said charges into the casing, and
the existence outside the casing of high potentials due to the high voltage of the circuit.

The protection means eliminate overloads and even short circuits that the plasma can generate in TWTA of a telecommunications satellite.

In a preferred embodiment of the device in accordance with the invention, the protection means comprise an electrically conductive plate outside or inside the casing, fixed and electrically connected to the casing, facing the opening and projecting over the periphery of the opening.

In one embodiment the protection means comprise two electrically conductive plates, respectively inside and outside the casing, fixed and electrically connected to the casing, facing the opening and projecting over the periphery of the opening.

The plate which is inside the casing is preferably covered with an electrically insulative material on the same side as the circuit.

In a preferred embodiment of the invention each conductive plate is a thin foil.

Instead of one or two plates, the protection means can comprise an electrically conductive grid which is fixed and electrically connected to the casing and which closes the opening.

The electrical charges of opposite sign to the high voltage come from a plasma, for example.

Each circuit can comprise a traveling wave tube amplifier or a power supply circuit of onboard equipment which uses voltages such that operation of the circuit can be interfered with by the presence of a plasma.

The invention also concerns a satellite comprising at least one ion thruster or operating in the presence of a natural plasma, the satellite further comprising at least one device according to the invention, the electrical charges:
coming from the plasma generated by the ion thruster or from the natural plasma, or
being created artificially by a generator.

BRIEF DESCRIPTION OF THE DRAWING

The present invention will be better understood after reading the following description of embodiments of the invention given by way of non-limiting example only and with reference to the accompanying drawing, in which.

DETAILED DESCRIPTION OF PREFERRED EMBODIMENTS

Figure 1:
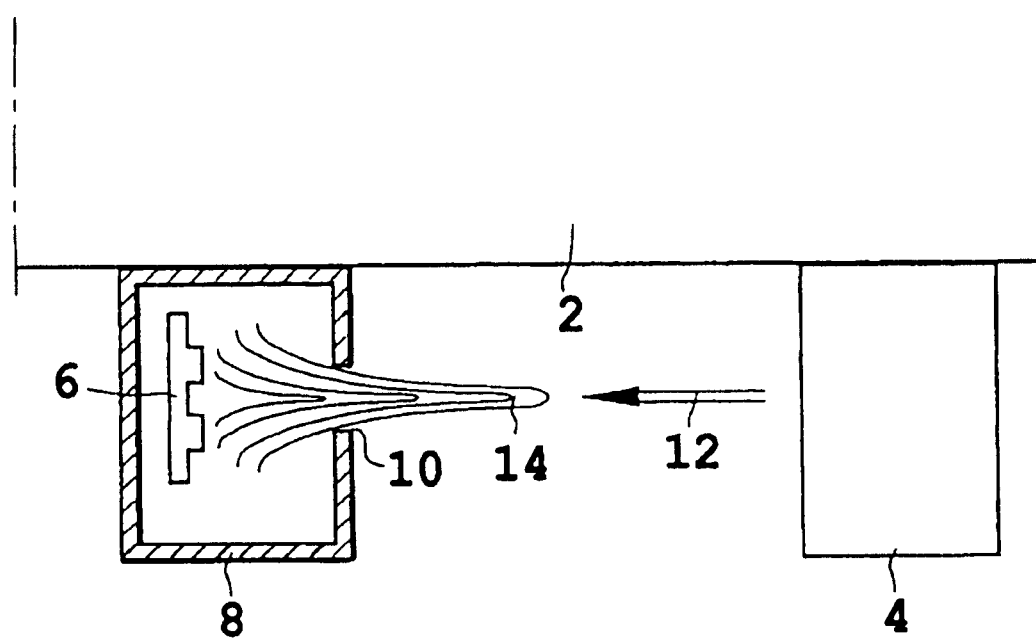
FIG. 1 is a diagrammatic view of a satellite equipped with a prior art high-voltage device and an ion thruster.

FIG. 1 is a highly schematic sectional view of a satellite 2 equipped with one or more ion thrusters, for example the thruster 4, and telecommunications means including TWTA. Only a prior art device of the telecommunications means is shown, comprising high-voltage TWTA power supply circuits 6 inside a metal casing 8.

The casing has vents, such as the vent 10, to establish communication between the inside and the outside of the casing to facilitate degassing of the interior of the casing when the satellite is in space.

When the ion thruster 4 operates, it generates a plasma and a portion 12 of the plasma travels towards the casing 8 and enters it through the vents.

Electrical potentials leak through the vents and FIG. 1 shows the corresponding equipotentials 14.

The leaks considerably increase the ingress of plasma by attracting the charges of the plasma whose sign is the opposite of that of the high voltage of the circuits.

The invention addresses this problem by opposing ingress of the plasma via the vents and electrical potentials leaking out through the vents, without blocking the vents.

Figure 3:
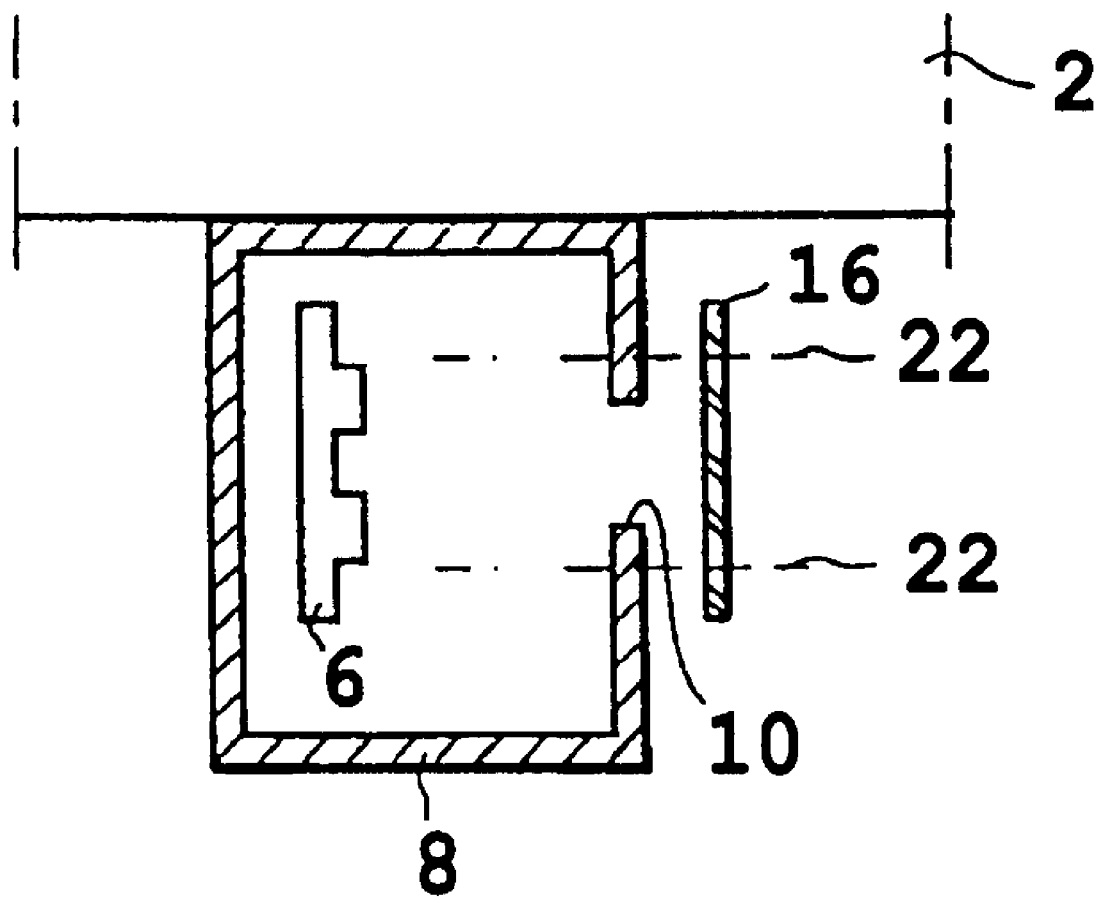
FIG. 3 is a diagrammatic view of another particular embodiment of the present invention.

FIG. 3 is a highly diagrammatic sectional view of a device in accordance with the invention, comprising the circuits 6 from FIG. 1 in the casing 8 and also a metal plate, which is preferably very thin (for reasons of weight), such as a foil 16 outside the casing 8, fixed and electrically connected to it, facing each vent 10 and projecting over the periphery of the vent.

Figure 4:
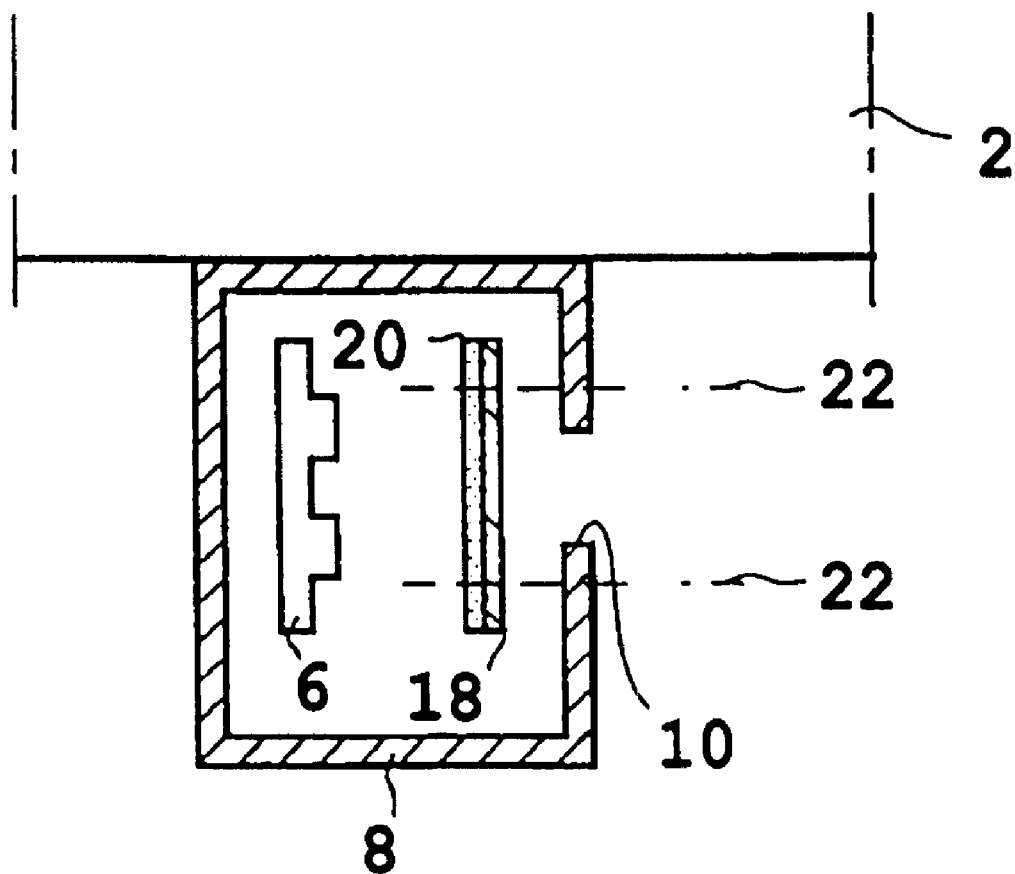
FIG. 4 is a diagrammatic view of yet another particular embodiment of the present invention.

In a different embodiment that is illustrated in FIG. 4, a foil 18 inside the casing 8 is fixed and electrically connected to it, facing each vent 10, so that the foil projects over the periphery of the corresponding vent and is disposed between the vent and the high-voltage circuits.

The side of the foil 18 facing the circuits 6 is preferably covered with an electrically insulative coating 20 to prevent discharges between the high voltage and the foil.

Figure 2:
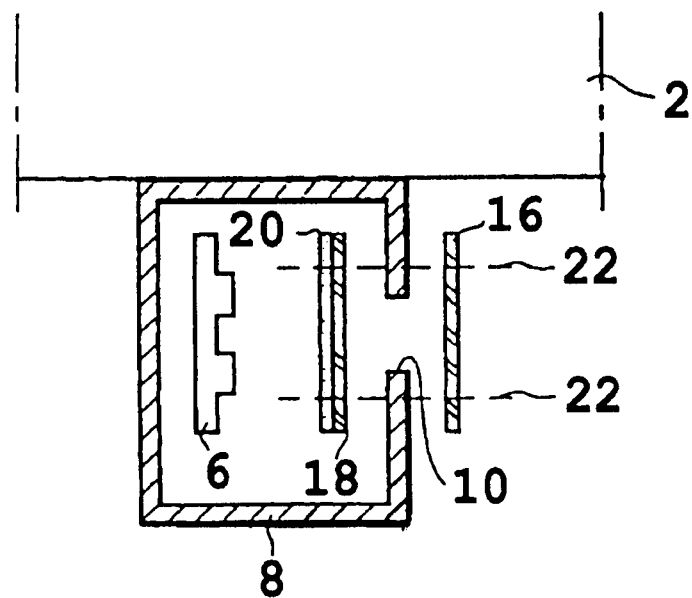
FIG. 2 is a diagrammatic view of one particular embodiment of a device in accordance with the invention.

It is even possible to use an internal foil 16 and an external foil 18 (provided with an insulative layer 20) facing the same vent 10, as illustrated in FIG. 2.

The association of a foil and the wall of the casing at the periphery of the corresponding vent constitutes a chicane which opposes ingress of plasma, with increasing efficiency as the ratio of the distance from the foil to the casing to the size of the foil (i.e. the diameter of the foil if it is circular) gets smaller.

Metal rivets or screws (symbolized by the chaindotted line 22) can be used to fix each foil and apply the voltage to it, for example.

The shape, dimensions and material of a foil are chosen according to the shape of the corresponding opening (the vent in this example), the distance between the foil and the opening, the distance between the high-voltage circuits and the foil, the thickness of the walls of the casing, the characteristics of the high-voltage and the characteristics of the plasma.

By way of non-limiting example, for a circular opening with a diameter of 1 mm, a casing having walls 1 mm thick, a high voltage of 6 kV, a conventional ion thruster plasma and high-voltage circuits in the casing at a distance of 20 mm from the opening, a 20 mm diameter circular copper foil is used on the outside of the casing at a distance of 1 mm from the opening.

Figure 5:
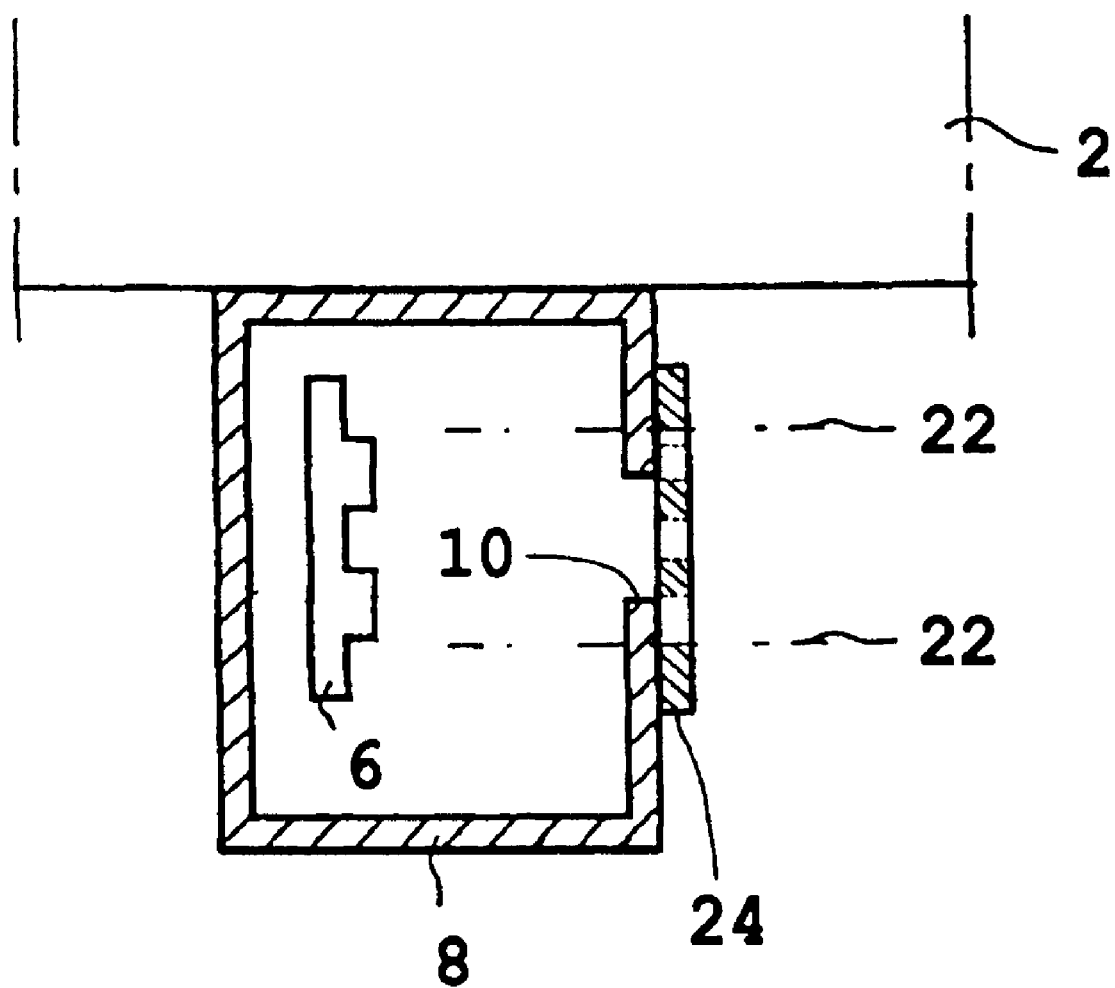
FIG. 5 is a diagrammatic view of still another particular embodiment of the present invention.

In some cases, instead of using metal plates, each opening 10 can be closed by a metal grid 24 fixed and electrically connected to the casing, as illustrated in FIG. 5

The present invention is not limited to the examples given. It can be used with any high-voltage device in whose vicinity there may be electrical charges of an ambient plasma or a plasma created artificially by a generator.

What is claimed is:

1. A device comprising:
   at least one high-voltage circuit, and
   a casing containing the circuit and having at least one opening which provides communication between the inside and the outside of the casing, wherein electrical charges of a sign that is opposite to a sign of the high voltage are present outside the casing and capable of entering the casing,
   the device further comprising:
   protection means which do not block access to the at least one opening and are adapted to oppose:
   the ingress of said electrical charges into the casing, and
   the egress of high potentials from inside said casing to outside said casing due to the high-voltage of the at least one high-voltage circuit, wherein the protection means comprise two electrically conductive plates, respectively inside and outside the casing, fixed and electrically coupled to the casing, facing the at least one opening and projecting over the periphery of the at least one opening.

2. A device comprising:
   at least one high-voltage circuit, and
   a casing containing the circuit and having at least one opening which provides communication between the inside and the outside of the casing, wherein electrical charges of a sign that is opposite to a sign of the high voltage are present outside the casing and capable of entering the casing,
   the device further comprising:
   protection means which do not block access to the at least one opening and are adapted to oppose:
   the ingress of said electrical charges into the casing, and
   the egress of high potentials from inside said casing to outside said casing due to the high-voltage of the at least one high-voltage circuit, wherein the protection means comprise an electrically conductive plate one of outside and inside the casing, fixed and electrically coupled to the casing, facing the at least one opening and projecting over the periphery of the at least one opening.

3. A device according to claim 2, wherein the at least one high-voltage circuit is a power supply circuit of onboard equipment and uses voltages such that operation of the circuit can be interfered with by the presence of a plasma.

4. A device according to claim 2, wherein if the electrically conductive plate which is inside the casing, said electrically conductive plate is covered with an electrically insulative material on the same side as the at least one high-voltage circuit.

5. A device according to claim 2, wherein each conductive plate is a foil.

6. A device according to claim 2, wherein the protection means comprise an electrically conductive grid which is fixed and electrically coupled to the casing and which closes the at least one opening without substantially blocking access to the at least one opening.

7. A device according to claim 2, wherein the electrical charges come from a plasma.

8. A device according to claim 2, wherein the at least one high-voltage circuit comprises a traveling wave tube amplifier.

9. The device of claim 2, wherein a size of said protection means is determined in accordance with a shape of said at least one opening, a distance between said protection means and said opening, a thickness of a wall of said casing, a characteristic of said high-voltage circuit and a characteristic of said electrical charges that are capable of entering the casing.

10. The device of claim 9, wherein said at least one opening is circular and has a diameter of 1 mm, said thickness of said wall of said casing is 1 mm, said electrical charges that are capable of entering the casing comprise ion thruster plasma, and said protection means is circular and has a 20 mm diameter and is positioned 1 mm from said casing.

11. The device of claim 2, further comprising a fastening means for coupling said protection means to said casing.

12. The device of claim 11, wherein said fastening means comprises at least one of a rivet and a screw.

13. A device that protects a high-voltage circuit against mobile electrical charges, comprising:
   a casing that contains said high-voltage circuit and has at least one opening, wherein plasma outside of said casing is positioned to enter said casing;
   an electrically conductive device that substantially prevents said plasma from entering said casing, and substantially eliminates the existence of high potentials outside of said casing that can be formed based on behavior of said high-voltage circuit, wherein said electrically conductive device comprises at least one of:
   a first electrically conductive plate facing said opening and projecting over a periphery of said opening on a first side of said casing, and a second electrically conductive plate facing said opening and projecting over said periphery of said opening on a second side of said casing, wherein said first electrically conductive plate and said second electrically conductive plate are electrically coupled to said casing.

14. A device that protects a high-voltage circuit against mobile electrical charges, comprising:

a casing that contains said high-voltage circuit and has at least one opening, wherein plasma outside of said casing is positioned to enter said casing;

an electrically conductive device that substantially prevents said plasma from entering said casing, and substantially eliminates the existence of high potentials outside of said casing that can be formed based on behavior of said high-voltage circuit, wherein said electrically conductive device comprises an electrically conductive grid that closes said opening without blocking access to said opening.

* * * * *